United States Patent [19]

Kawashima et al.

[11] Patent Number: 5,319,311
[45] Date of Patent: Jun. 7, 1994

[54] CABLE FAULT LOCATION METHOD WITH DISCHARGE DELAY COMPENSATION USING MULTIPLE PULSES WITH DIFFERENT RATES OF VOLTAGE INCREASE

[75] Inventors: Takao Kawashima, Nagoya; Masayoshi Arakane, Kuwana; Hitoshi Sugiyama, Toyoake; Tatenori Kano, Nagoya; Yasutaka Fujiwara, Ebina; Jun-ichi Shinagawa, Yokohama; Hideki Yamamura, Kanazawa, all of Japan

[73] Assignees: Chuba Electric Power Company, Inc., Nagaya; Showa Electric Wire and Cable Co., Ltd., Kawasaki, both of Japan

[21] Appl. No.: 849,927

[22] Filed: Mar. 12, 1992

[30] Foreign Application Priority Data

Mar. 13, 1991 [JP] Japan ............................ 3-073834

[51] Int. Cl.⁵ ............................................. G01R 31/11
[52] U.S. Cl. .................................... 324/534; 324/533; 324/544; 379/26
[58] Field of Search ............... 324/527, 532, 533, 534, 324/544; 340/870.19, 870.20; 379/26

[56] References Cited

U.S. PATENT DOCUMENTS 3,909,712  9/1975  Rietz et al. ........................... 379/26
4,013,948  3/1977  Tanaka et al. ........................ 324/534
4,491,782  1/1985  Bellis et al. .......................... 324/533
4,649,335  3/1987  Lassaux et al. ....................... 379/26
5,083,086  1/1992  Steiner ............................... 324/533

FOREIGN PATENT DOCUMENTS 0215301  4/1968  U.S.S.R. ............................... 324/533

OTHER PUBLICATIONS

Komoda et al, "Development of a Current Detection Type Cable Fault Locator", IEEE Trans. on Power Delivery, pp. 541-545, Apr. 1991.

Primary Examiner—Kenneth A. Wieder
Assistant Examiner—Christopher Tobin
Attorney, Agent, or Firm—Whitham & Marhoefer

[57] ABSTRACT

Two or more rising pulse waves having different rates of voltage increase are applied to a measuring end of a cable and reflected waves from a fault point on the cable are detected to measure a turnaround propagation time between the measuring end and the fault point. Additionally, ratios of the rates of voltage increase of one pulse wave and the other pulse waves are calculated. A discharge delay time at the fault point is calculated from time differences of the measured turnaround propagation time and the ratios of the voltage increasing speeds and the discharge delay time is subtracted from the measured turnaround propagation time to calculate a real turnaround propagation time.

8 Claims, 4 Drawing Sheets

CABLE FAULT LOCATION METHOD WITH DISCHARGE DELAY COMPENSATION USING MULTIPLE PULSES WITH DIFFERENT RATES OF VOLTAGE INCREASE

BACKGROUND OF THE INVENTION

The present invention relates to a fault location method of detecting a fault point on a cable in which a ground fault occurs by means of a pulse reflection method.

When a ground fault or the like occurs on a cable, a fault section is disconnected by a protection relay apparatus and after the fault point has been detected exactly, fault recovery work is performed at the fault location. A pulse reflection method is known as one of methods of detecting the fault point location. In the pulse reflection method, an electrical pulse, for the purpose of measuring a distance to a fault point location, is applied to the cable from a measuring end of the cable and a reflected wave generated by an electric discharge at the fault point is received back at the measuring end, so that a distance from the measuring end to the fault point can be calculated.

FIG. 4 is a diagram illustrating the principle of the well known and widely used pulse reflection method.

FIG. 4, a square transmission pulse 1 applied to the measuring end of the cable reaches the fault point after a time $\tau$. In this case, a time until a reflected wave 2 is observed after the transmission wave has been observed is $2\tau$.

When a cable propagation velocity of an electrical pulse is S, and a distance from the measuring end to the fault point is L, the following equation is given:

$$2\tau = 2L/S \qquad (1)$$

A distance L to the fault point can be calculated by using the equation (1).

FIG. 5 shows a waveform of the propagation wave 1 which propagates in the cable.

As shown in FIG. 5, the propagation wave 1 propagating in the cable has a smooth, gradually rising portion and a smooth gradually falling portion.

A break hole, in the form of a pinhole, is typically formed in an insulating layer of the cable at the fault point so that a portion between a conductor and a shield layer is air-insulated by the break hole. Accordingly, when the electrical pulse, having a predetermined voltage, is applied from the measuring end of the cable to generate the electric discharge at the fault point and the reflected wave from the fault point is received, a phenomenon as shown in FIG. 6 occurs.

FIG. 6 is a graph showing a relation of the propagation wave 1 which has reached the fault point and an electric discharge starting voltage Vb at the fault point. In the graph of FIG. 6, the abscissa represents a time and the ordinate represents a voltage.

As shown in FIG. 6, after the propagation wave 1 has reached the fault point, its voltage is increased at a constant rate and reaches the electric discharge starting voltage Vb after a time $\Delta T$ has elapsed. When the propagation wave 1 reaches the discharge starting voltage Vb, the air insulation in the break hole is broken and the electric discharge starts, so that the reflected wave is generated. Accordingly, when an actually measured value of the time until the reflected wave is received after the electrical pulse has been applied at the measuring point is t and a real turnaround propagation time of the electrical pulse is $2\tau$, the actually measured value t is expressed as follows:

$$t = 2\tau + \Delta T \qquad (2)$$

As represented by the equation (2), the actually measured value t includes a discharge delay time $\Delta T$ produced as an error in accordance with an actual voltage increasing speed of the propagation wave 1. For example, the propagation velocity of the electrical pulse in the cable is about 160 to 200 m per $\mu$ second. Accordingly, when the discharge delay time $\Delta T$ is assumed to be 0.5 $\mu$ second, the detection error is about 80 to 100 m. Thus, the conventional pulse reflection method must be used for detection of the fault point on condition that the detection error to this extent is contained in the measured value.

However, if the fault point is detected correctly, the fault recovery work can be made rapidly. Particularly, in an underground cable which can not be inspected directly with the naked eye, the detection of the fault point with higher accuracy is desired.

SUMMARY OF THE INVENTION

It is an object of the present invention to provide a fault location method of a cable capable of detecting a fault point on the cable exactly by using a pulse reflection method sometimes referred to herein as a pulse reflection method.

According to a first aspect of the present invention, there is provided a fault location method of a cable comprising applying to a measuring end of the cable first and second rising pulse waves having different rates of voltage increase to the discharge starting voltage at the fault point, detecting reflected waves from the fault point of both of the pulse waves with different rates of voltage increase, measuring turnaround propagation times between the measuring end and the fault point of both of the pulse waves, calculating a discharge delay time of one of the pulse waves at the fault point on the basis of a relation of a time difference of the measured turnaround propagation times and a ratio of the respective rates of voltage increase to both the pulse waves, and subtracting the discharge delay time from the turnaround propagation time of the one pulse wave to calculate a real turnaround propagation time.

In order to detect a reflected wave from the fault point without influence of a termination portion and a branch portion of the cable, pulse waves may be applied simultaneously to respective cables for a normal phase and a faulty phase and a reflected wave from the termination portion may be canceled.

This method uses two kinds of rising pulse waves having differing rates at which the voltage increases. The rising pulse waves do not start electric discharge until voltages thereof reach the electric discharge starting voltage at the fault point and accordingly a time delay due to the fact the discharge does not occur until voltage of the pulse rises to the discharge starting voltage. Thus, when the rates of voltage increase of both of the rising pulse waves are different from each other, the discharge delay times are also different. Accordingly, the time difference between the turnaround propagation times calculated by using both of the rising pulse waves is equal to a difference between the discharge delay times. Further, the difference between the discharge delay times can be expressed by a fixed relational equation with the rates of voltage increase of both of the rising pulse waves. Accordingly, the discharge delay time of one of the rising pulse waves is calculated on the basis of the relational equation and when the calculated discharge delay time is subtracted from the turnaround propagation time, the real turnaround propagation time is thereby calculated.

In this manner, according to the present invention, since an error due to the discharge delay time can be removed, the fault point on the cable can be detected exactly.

According to a second aspect of the present invention, there is provided a fault location method of a cable comprising applying to a measuring end of the cable a plurality (three or more) of rising pulse waves having different rates of voltage increase, detecting reflected waves from the fault point, measuring turnaround propagation times of the plurality of the rising pulse waves, calculating time differences between the turnaround propagation time of one of pulse waves and the turnaround propagation times of the other plurality of pulse waves, causing the time differences to corresponding to ratios of the voltage increasing speed of one pulse wave and voltage increasing speeds of other plurality of pulse waves to calculate a plurality of discharge delay times of the one pulse wave at the fault point, calculating an average value of the discharge delay times, and subtracting the average value from the turnaround propagation time of one of the pulse waves to calculate a real turnaround propagation time.

According to the second aspect of the present invention, since the plurality of rising pulse waves for one of the pulse waves are utilized to calculate the plurality of discharge delay times and its average value, the fault point on the cable can be detected exactly.

DESCRIPTION OF THE PREFERRED EMBODIMENTS

An embodiment of the present invention is now described in detail with reference to the accompanying drawings.

Figure 1:
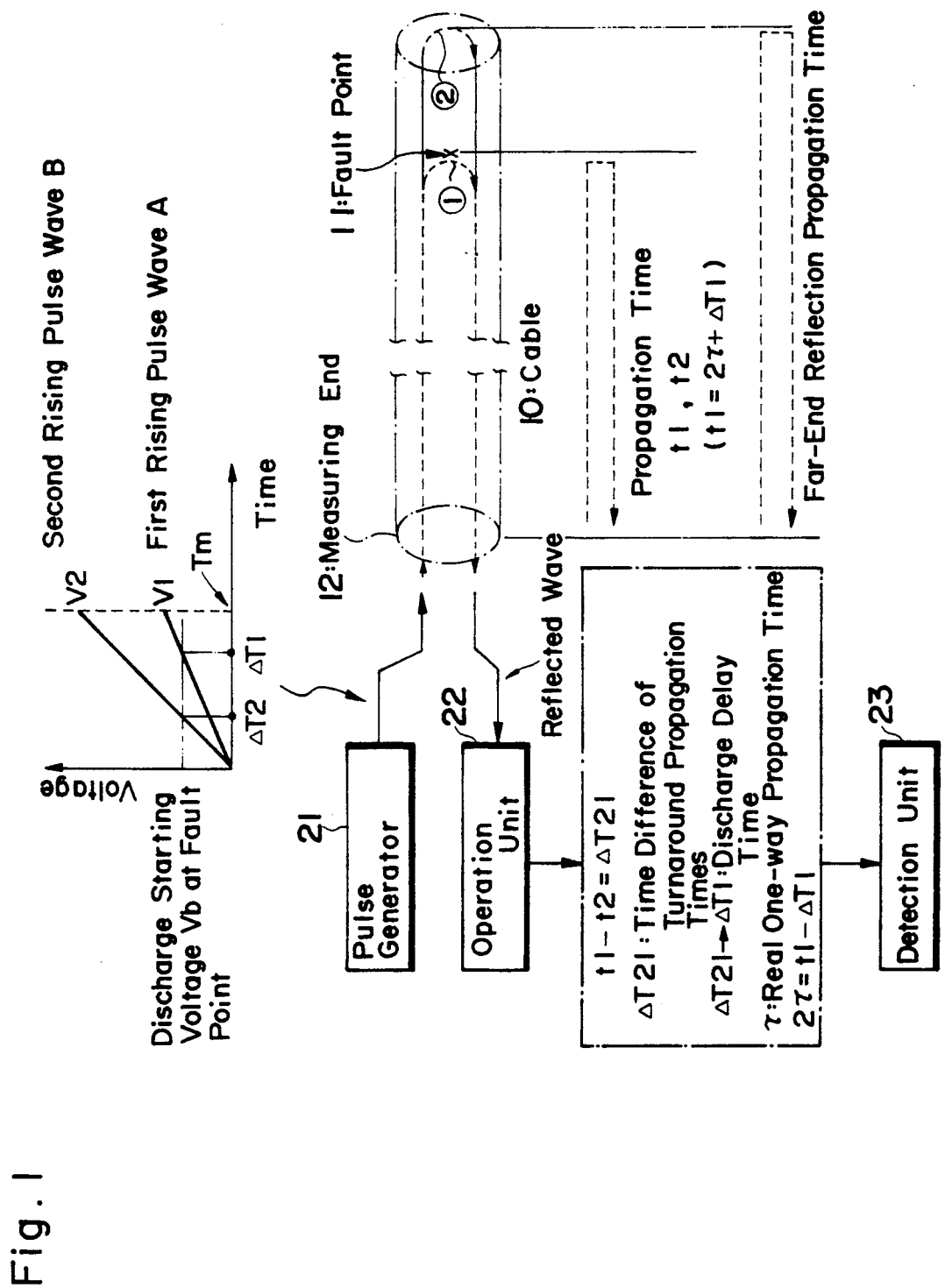
FIG. 1 schematically illustrates an embodiment of a fault location method of a cable according to the present invention.

FIG. 1 schematically illustrates an embodiment of a fault location method of a cable according to the first invention.

In FIG. 1, it is assumed that a dielectric breakdown accident occurs in a fault point 11 of a cable 10, and the fault point detection according to the method of the present invention is to be made at a measuring end 12 of the cable 10.

A pulse generator 12 is used to apply two rising pulse waves A and, B with different rates of voltage increase, as shown in a graph depicted at upper-left corner of FIG. 1 to the measuring end 12 of the cable 10. The first rising pulse wave A has a voltage increasing rate set to have a substantially linear characteristic requiring a discharge delay time of $\Delta T1$ until the pulse wave A reaches a discharge starting voltage Vb, while the second rising pulse wave B has a voltage increasing rate set to have a substantially linear characteristic and requires a discharge delay time of $\Delta T2$ until the pulse wave B reaches the same voltage Vb. The discharge delay times $\Delta T1$ and $\Delta T2$ are not known previously, and one pulse having a voltage which reaches a voltage V1 in a certain time Tm is defined as the first rising pulse wave A while the other pulse having a voltage reaching a voltage V2 which is twice the voltage V1 in the same time Tm is defined as the second rising pulse wave B.

When such rising pulse waves A and B are applied to the measuring end 12, the pulse waves reach the fault point 11 as shown by broken line ① of FIG. 1, so that electrical discharges occur at the fault point 11 and reflected waves are received by an operation unit 22. The operation unit 22 calculates times until the reflected pulses are received after the pulse waves have been applied to obtain a turnaround propagation time t1 for the first pulse wave A and a turnaround propagation time t2 for the second pulse wave B.

The turnaround propagation time t1, for example, is expressed by the following equation, where a real one-way propagation time is $\tau$ and the discharge delay time is $\Delta T1$, as described above.

$$t1 = 2\tau + \Delta T1 \tag{3}$$

The operation unit 22 calculates a time difference $\Delta T21$ between the turnaround propagation times t1 and t2 of the two rising pulse waves A and B.

Further, it can be understood by using a simple geometrical rule in the graph depicted at upper-left corner of FIG. 1 that a ratio of the discharge delay time $\Delta T1$ of the first rising pulse wave A and the discharge delay time $\Delta T2$ of the second rising pulse wave B is equal to a ratio k of the voltages V1 and V2 at the time tm. This relation is shown in the following equation (4).

$$\Delta T1/\Delta T2 = V2/V1 = k \tag{4}$$

On the other hand, a difference of the turnaround propagation times t1 and t2 of the pulse waves A and B is equal to a difference of the discharge delay times $\Delta T1$ and $\Delta T2$ as shown in the following equation (5). Further, when the time $\Delta T2$ is expressed by the time $\Delta T1$ and the ratio k in the equation (4), $\Delta T2 = \Delta T1/k$ and accordingly the time difference of the turnaround propagation time can be expressed by using $\Delta T1$ as shown in the equation (5).

$$\begin{aligned} t1 - t2 &= \Delta T1 - \Delta T2 \\ &= \Delta T1 - \Delta T1/k \\ &= \Delta T1\{(k-1)/k\} \end{aligned} \tag{5}$$

Consequently, the discharge delay time $\Delta T1$ is calculated as shown in the following equation (6).

$$\Delta T1 = k(t1 - t2)/(k - 1) \tag{6}$$

In this manner, the discharge delay time ΔT1 for the first rising pulse wave A can be obtained by the calculation.

The real turnaround propagation time $\tau$ can be calculated from the relation of the equations (6) and (3) as follows:

$$2\tau = t1 - \Delta T1 \qquad (7)$$

Figure 4:
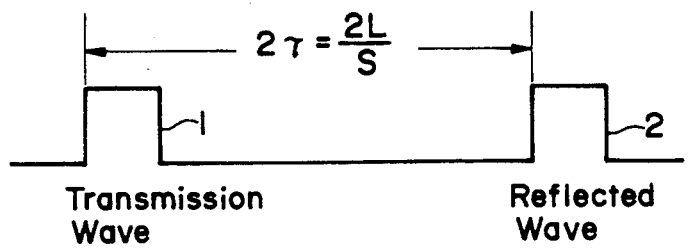
FIG. 4 is a diagram illustrating the principle of the well known and widely used pulse reflection method.
Figure 5:
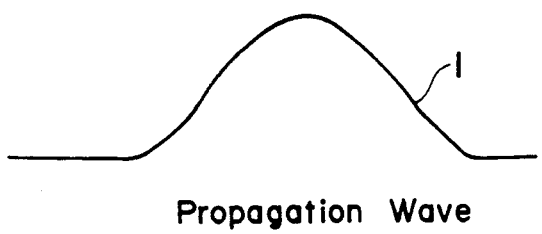
FIG. 5 is a waveform diagram of a propagation wave which is propagated in a cable.
Figure 6:
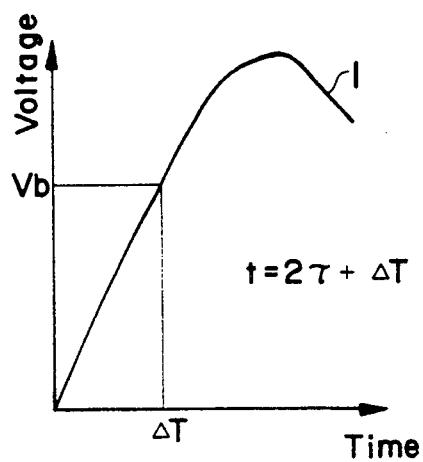
FIG. 6 is a graph illustrating a discharge delay time for explaining a problem in a prior art.

A detection unit 23 calculates the distance from the measuring end to the fault point correctly on the basis of the above-mentioned operation result of the operation unit 22. The operation method uses the equation (1) described in the prior art as shown in FIG. 4. That is, when the cable propagation velocity of the electrical pulse is S and the distance from the measuring end to the fault point is L, the real turnaround propagation time $\tau$ is obtained from $2\tau = 2L/S$. Accordingly, the distance L is calculated correctly from the equation $L = \tau S$.

The fault location method of a cable according to the first invention has been described as above.

In the actual measurement, when a peak voltage of the rising pulse wave applied to the cable is smaller than the discharge starting voltage Vb at the fault point, the electric discharge does not occur at the fault point and the turnaround propagation time can not be measured. Further, the measurements of this kind are advantageously repeated plural times with different conditions in order to enhance the accuracy of the measurement.

The fault location method of a cable according to the second invention is now described with reference to FIG. 2.

Figure 2:
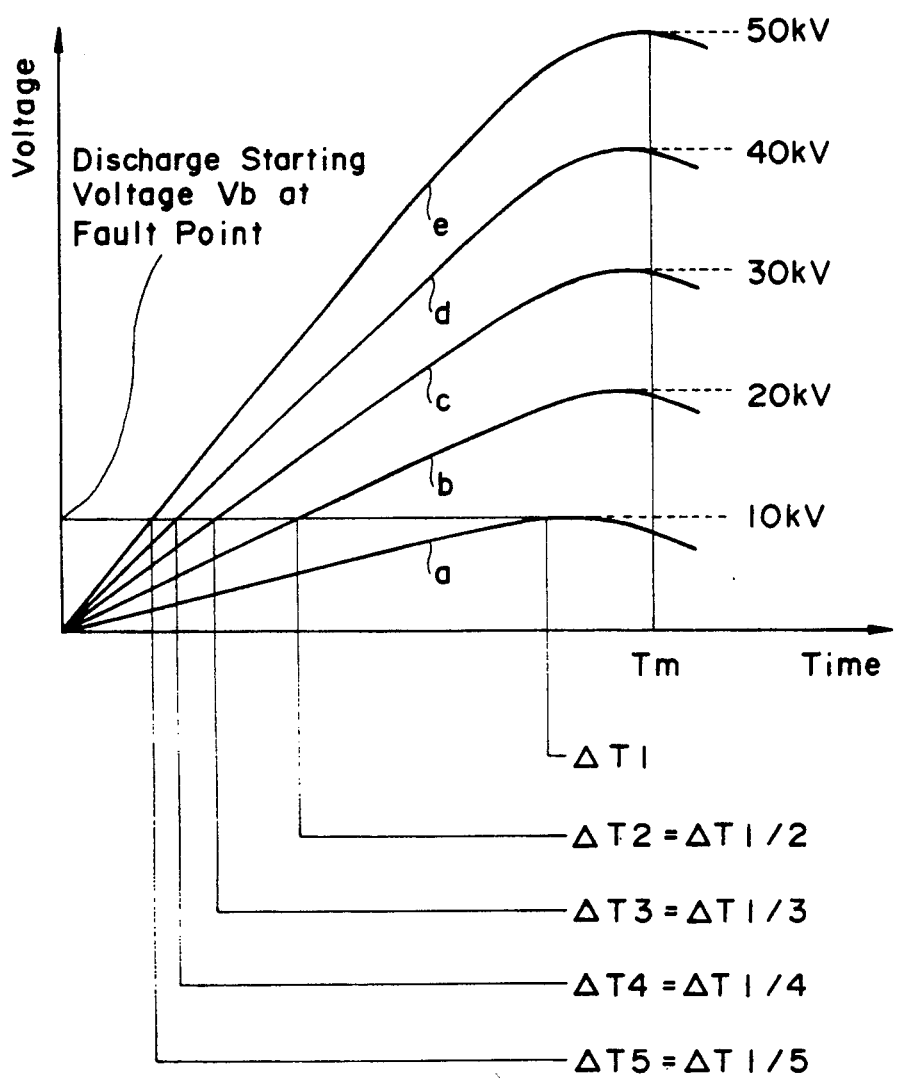
FIG. 2 is a graph showing waveforms of rising pulse waves applied in order to explain an actual embodiment of the present invention.

In this embodiment, 5 kinds of rising pulse waves a to e are applied to the measuring end of the cable as shown in FIG. 2. These pulse waves have voltage increasing speeds of voltages reaching 10, 20, 30, 40 and 50 KV in the time Tm, for example.

As described above, in the method of the present invention, it is preferably that the rates of voltage increase of the pulse waves are set to have a substantially linear characteristic until the voltages thereof reach the discharge starting voltage Vb, at least at the fault point, and ratios between the rates of voltage increase are set to be equal to simple integer ratios in order to facilitate the calculation.

When the peak voltages of the rising pulse waves are set as above, the time that the voltages of the pulse waves reach the discharge starting voltage Vb at the fault point, that is, the discharge delay times are ΔT1 for the pulse wave a with 10 KV, ΔT2 for the pulse wave b with 20 KV, ΔT3 for the pulse wave c with 30 KV, ΔT4 for the pulse wave d with 40 KV and ΔT5 for the pulse wave e with 50 KV.

The relation between the discharge delay times ΔT1 to ΔT5 is expressed by the following equations (8) to (11) when the discharge delay time ΔT1 is used as a reference.

$$\Delta T2 = \Delta T\tfrac{1}{2} \qquad (8)$$

$$\Delta T3 = \Delta T\tfrac{1}{3} \qquad (9)$$

$$\Delta T4 = \Delta T\tfrac{1}{4} \qquad (10)$$

$$\Delta T5 = \Delta T1/5 \qquad (11)$$

Generally, the equivalent circuit of the cable can be expressed in terms of distributed, constant impedance circuit element and the cable can be treated as a resistance element when the pulse is applied to the cable. Accordingly, when a predetermined voltage is applied to the measuring end of the cable from a pulse generator circuit including a series circuit of L and C, a voltage increasing curve is expressed by an exponential curve.

Since the applied voltage is a coefficient of the curve, a rising portion of the voltage waveform can be seen as linear and the rate of voltage increase thereof is just proportional to the applied voltage. Accordingly, when the peak voltages are set to predetermined integer ratios as shown in FIG. 2 actually, the discharge starting voltages can be expressed by the integer ratios.

Figure 3:
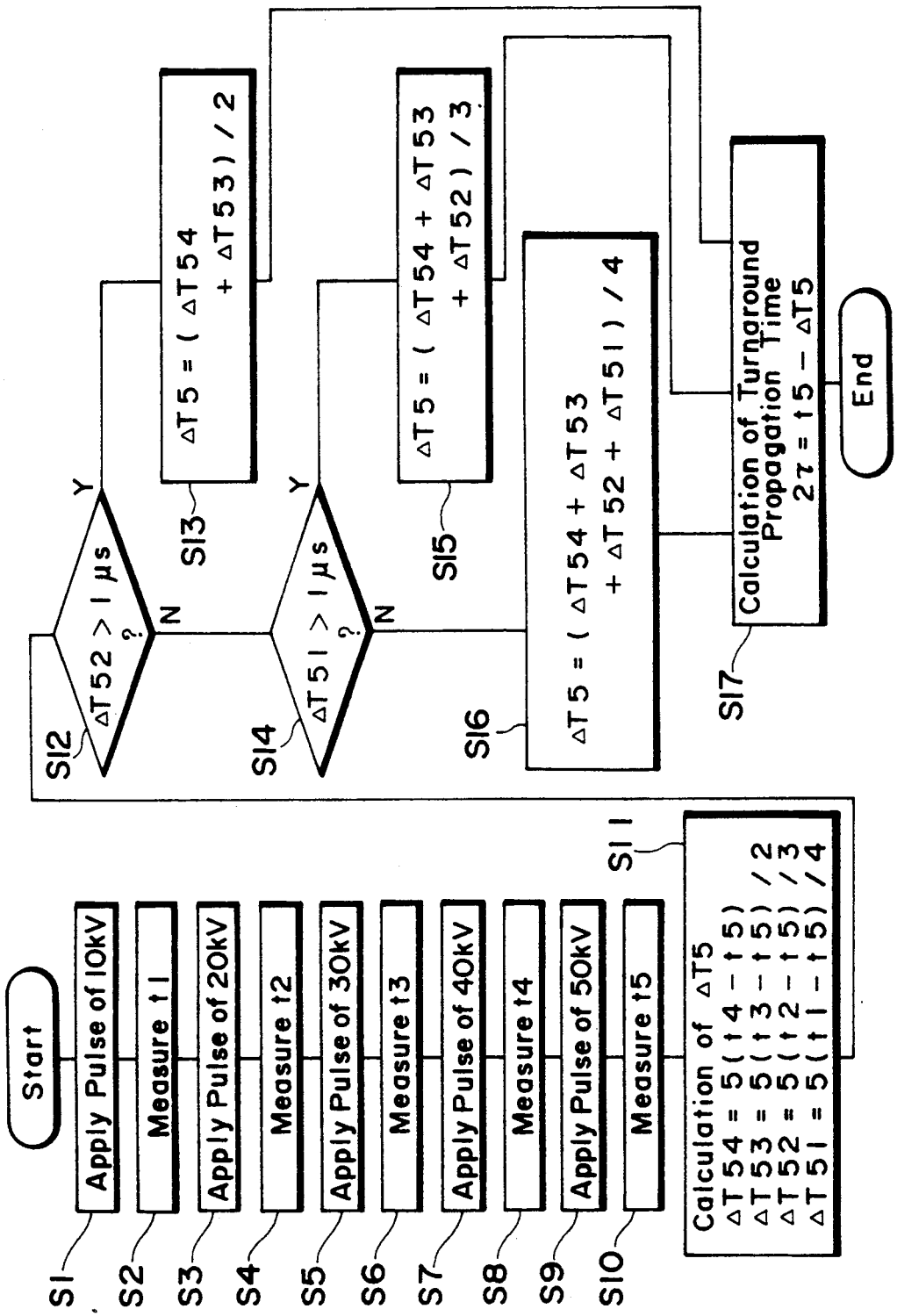
FIG. 3 is a flow chart illustrating a procedure of the actual embodiment according to the method of the present invention.

An actual procedure of the detection method of the present invention is now described with reference to FIG. 3.

First of all, a pulse of 10 KV (in the flow chart of FIG. 3 the rising pulse waves a to e are expressed as pulse merely) is applied (step S1). The turnaround propagation time t1 thereof is measured (step S2). Then, a pulse of 20 KV is applied (step S3). The turnaround propagation time t2 thereof is measured (step S4). Similarly, a pulse of 30 KV is applied (step S5) and the turnaround propagation time t3 thereof is measured (step S6). A pulse of 40 KV is further applied (step S7) and the turnaround propagation time t4 thereof is measured (step S8). Finally, a pulse of 50 KV is applied (step S9) and the turnaround propagation time t5 is measured (step S10). Consequently, collection of data necessary for calculation is completed. Then, the calculation by the operation unit 22 shown in FIG. 1 is started.

The turnaround propagation times t1 to t5 can be expressed by the following equations (12) to (16) by using the real one-way propagation time $\tau$ and the discharge delay times ΔT1 to ΔT5.

$$t1 = 2\tau + \Delta T1 \text{(10 KV applied)} \qquad (12)$$

$$t2 = 2\tau + \Delta T2 \text{(20 KV applied)} \qquad (13)$$

$$t3 = 2\tau + \Delta T3 \text{(30 KV applied)} \qquad (14)$$

$$t4 = 2\tau + \Delta T4 \text{(40 KV applied)} \qquad (15)$$

$$t5 = 2\tau + \Delta T5 \text{(50 KV applied)} \qquad (16)$$

Then, the operation unit 22 calculates the discharge delay time ΔT5 of the rising pulse wave in step 11.

The calculation can be made as described by the following equations (17) to (20) by using the equation (8) to (11) in the same manner as described by using the equation (5).

ΔT54 represents the discharge delay time ΔT5 calculated from the turnaround propagation times t4 and t5 for the pulse waves d and e, ΔT53 represents the discharge delay time ΔT5 calculated from the turnaround propagation times t3 and t5 for the pulse waves c and e, ΔT52 represents the discharge delay time ΔT5 calculated from the turnaround propagation times t2 and t5 for the pulse waves b and e, ΔT51 represents the discharge delay time ΔT5 calculated from the turnaround propagation times t1 and t5 for the pulse waves a and e.

$$\Delta T54 = 5(t4 - t5) \qquad (17)$$

$$\Delta T53 = 5(t3 - t5)/2 \qquad (18)$$

$$\Delta T52 = 5(t2 - t5)/3 \qquad (19)$$

$$\Delta T51 = 5(t1-t5)/4 \qquad (20)$$

More particularly, one discharge delay time can be calculated by only two measurements as described in the equation (5) theoretically, while the discharge delay times ΔT5 for the pulse wave e are obtained by five measurements separately and an average value thereof is calculated, so that measurement with higher accuracy can be attained. Actually, there is a case that the electric discharge does not occur for the pulse wave a with 10 KV shown in FIG. 2, for example. In such a case, the measured value using the pulse wave a is excepted and the discharge delay time ΔT5 is calculated.

After the calculation of step S11, the operation unit 22 makes judgment as to exception of the measured values when the electrical discharge does not occur.

More particularly, judgment as to whether the discharge delay time ΔT52 of the pulse waves b and e, for example, is larger than 1μ second or not is made. When the time ΔT52 is larger than 1μ second, it means that the measured value of one of the turnaround propagation time is not a value obtained by the electric discharge at the fault point. Accordingly, in this case, since the discharge delay time ΔT52 can not be used as data, the process proceeds to step S13 in which an average value of other discharge delay times ΔT54 and ΔT53 is calculated and ΔT5 is calculated.

On the other hand, in step S12, when it is judged that the discharge delay time ΔT52 is equal to or smaller than 1μ second, the process proceeds to step S24 in which it is judged whether the discharge delay time ΔT51 exceeds 1μ second. In this case, when the discharge delay time ΔT51 exceeds 1μ second, it is understood that the electric discharge by the rising pulse wave a does not occur, and the measured data as the turnaround propagation time t1 of the pulse wave a is neglected. Accordingly, in step S15, ΔT5 is calculated from an average value of other discharge delay times ΔT54. ΔT53 and ΔT52.

In step S14, when it is judged that the discharge delay time ΔT51 is equal to or smaller than 1μ second, the process proceeds to step S16 in which ΔT5 is calculated from an average value of four data of the discharge delay times ΔT54 to ΔT51.

In step S17, the operation unit 22 calculates the real turnaround propagation time on the basis of any calculation result of step S13, S14 or S15. This calculation is made in accordance with the following equation (21).

$$2\tau = t5 - \Delta T5 \qquad (21)$$

This calculation is the same as in the equation (7).

Finally, the detection unit 23 calculates the distance to the fault point on the basis of the real turnaround propagation time 2τ in accordance with the equation (1) similarly. Accordingly, detection of the fault point on the cable can be made with higher accuracy.

The present invention is not limited to the two embodiments described above.

The calculation procedure and equations for calculating the discharge delay time of the particular rising pulse wave from the turnaround propagation time of the pulse wave can be transformed variously in accordance with the principle thereof.

Further, the reflected wave from the fault point may be detected in any form of voltage or current, and a high-frequency current transformer, for example, may be provided in the measuring end to detect the reflected wave as a traveling-wave current.

The rising pulse wave applied to the measuring end of the cable may be at least two kinds and be many kinds including two kinds or more.

We claim:

1. A method for locating a fault point in an electrically conducting cable, comprising the steps of:

applying to a measuring end of said cable a first voltage pulse that increases at a first rate at least to a value where said first voltage pulse reaches a discharge starting voltage at said fault point;

detecting at said measuring end a reflected wave from said fault point generated by said first voltage pulse;

measuring a turnaround propagation time of said first voltage pulse from the time said first voltage pulse is applied to said measuring end to the time a reflected wave from said fault point is detected;

applying to a measuring end of said cable a second voltage pulse that increases at a second rate at least to a value where said second voltage pulse reaches a discharge starting voltage at said fault point, said second rate being different than said first rate;

detecting at said measuring end a reflected wave from said fault point generated by said second voltage pulse;

measuring a turnaround propagation time of said second voltage pulse from the time said second voltage pulse is applied to said measuring end to the time a reflected wave from said fault point is detected;

calculating a discharge delay time of said first voltage pulse and said second voltage pulse at said fault point on the basis of a relation of a time difference between the turnaround propagation time of said first voltage pulse and the turnaround propagation time of said second voltage pulse and the ratio of said first rate of increase of said first voltage pulse and said second rate of increase of said second voltage pulse; and subtracting said discharge delay time from said turnaround propagation time of said first voltage pulse or said second voltage pulse to calculate a corrected turnaround propagation time.

2. A method for locating a fault point in an electrically conducting cable as in claim 1, further including the step of calculating a ratio of said first rate of increase of said first voltage pulse and said second rate of increase of said second voltage pulse.

3. A method for locating a fault point in an electrically conducting cable as in claim 2, wherein said ratio is an integer.

4. A method for locating a fault point in an electrically conducting cable, comprising the steps of:

applying to a measuring end of said cable a first voltage pulse that increases at a first rate at least to a value where said first voltage pulse reaches a discharge starting voltage at said fault point;

detecting at said measuring end a reflected wave from said fault point generated by said first voltage pulse;

measuring a turnaround propagation time of said first voltage pulse from the time said first voltage pulse is applied to said measuring end to the time a reflected wave from said fault point is detected;

applying to a measuring end of said cable a second voltage pulse that increases at a second rate at least to a value where said second voltage pulse reaches a discharge starting voltage at said fault point, said second rate being different than said first rate;

detecting at said measuring end a reflected wave from said fault point generated by said second voltage pulse;

measuring a turnaround propagation time of said second voltage pulse from the time said second voltage pulse is applied to said measuring end to the time a reflected wave from said fault point is detected;

applying to a measuring end of said cable a third voltage pulse that increases at a third rate at least to a value where said third voltage pulse reaches a discharge starting voltage at said fault point, said third rate being different than said second rate and said first rate;

detecting at said measuring end a reflected wave from said fault point generated by said third voltage pulse;

measuring a turnaround propagation time of said third voltage pulse from the time said third voltage pulse is applied to said measuring end to the time a reflected wave from said fault point is detected;

calculating a plurality of discharge delay times from said first voltage pulse, said second voltage pulse and said third voltage pulse at said fault point on the basis of a relation of a time difference among the turnaround propagation time of said first voltage pulse, the turnaround propagation time of said second voltage pulse, and the turnaround propagation time of said third voltage pulse and the ratio of said first rate of increase of said first voltage pulse, the ratio of said second rate of increase of said second voltage pulse, and said ratio of said third rate of increase of said third voltage pulse;

calculating an average discharge delay time from said plurality of discharge delay time; and subtracting said average discharge delay time from said turnaround propagation time of said first voltage pulse or said second voltage or said third voltage pulse to calculate a corrected turnaround propagation time.

5. A method for locating a fault point in an electrically conducting cable as in claim 4 further including the step of calculating ratios of said first rate of increase of said first voltage pulse, said second rate of increase of said second voltage pulse and said third rate of increase of said third voltage pulse.

6. A method for locating a fault point in an electrically conducting cable as in claim 5, wherein said ratios are integers.

7. An apparatus for locating a fault point in an electrically conducting cable, a system comprising in combination:

means for applying to a measuring end of said cable a first voltage pulse that increases at a first rate at least to a value where said first voltage pulse reaches a discharge starting voltage at said fault point;

means for detecting at said measuring end a reflected wave from said fault point generated by said first voltage pulse;

means for measuring a turnaround propagation time of said first voltage pulse from the time said first voltage pulse is applied to said measuring end to the time a reflected wave from said fault point is detected;

means for applying to a measuring end of said cable a second voltage pulse that increases at a second rate at least to a value where said second voltage pulse reaches a discharge starting voltage at said fault point, said second rate being different than said first rate;

means for detecting at said measuring end a reflected wave from said fault point generated by said second voltage pulse;

means for measuring a turnaround propagation time of said second voltage pulse from the time said second voltage pulse is applied to said measuring end to the time a reflected wave from said fault point is detected;

means for calculating a discharge delay time of said first voltage pulse and said second voltage pulse at said fault point on the basis of a relation of a time difference between the turnaround propagation time of said first voltage pulse and the turnaround propagation time of said second voltage pulse and the ratio of said first rate of increase of said first voltage pulse and said second rate of increase of said second voltage pulse; and means for subtracting said discharge delay time from said turnaround propagation time of said first voltage pulse or said second voltage pulse to calculate a corrected turnaround propagation time.

8. An apparatus for locating a fault point in an electrically conducting cable, a system comprising in combination:

means for applying to a measuring end of said cable a first voltage pulse that increases at a first rate at least to a value where said first voltage pulse reaches a discharge starting voltage at said fault point;

means for detecting at said measuring end a reflected wave from said fault point generated by said first voltage pulse;

means for measuring a turnaround propagation time of said first voltage pulse from the time said first voltage pulse is applied to said measuring end to the time a reflected wave from said fault point is detected;

means for applying to a measuring end of said cable a second voltage pulse that increases at a second rate at least to a value where said second voltage pulse reaches a discharge starting voltage at said fault point, said second rate being different than said first rate;

means for detecting at said measuring end a reflected wave from said fault point generated by said second voltage pulse;

means for measuring a turnaround propagation time of said second voltage pulse from the time said second voltage pulse is applied to said measuring end to the time a reflected wave from said fault point is detected;

means for applying to a measuring end of said cable a third voltage pulse that increases at a third rate at least to a value where said third voltage pulse reaches a discharge starting voltage at said fault point, said third rate being different than said second rate and said first rate;

means for detecting at said measuring end a reflected wave from said fault point generated by said third voltage pulse;

means for measuring a turnaround propagation time of said third voltage pulse from the time said third voltage pulse is applied to said measuring end to the time a reflected wave from said fault point is detected;

means for calculating a plurality of discharge delay times from said first voltage pulse, said second voltage pulse and said third voltage pulse at said fault point on the basis of a relation of a time difference among the turnaround propagation time of said first voltage pulse, the turnaround propagation time of said second voltage pulse, and the turnaround propagation time of said third voltage pulse and the ratio of said first rate of increase of said first voltage pulse, the ratio of said second rate of increase of said second voltage pulse, and said ratio of said third rate of increase of said third voltage pulse;

means for calculating an average discharge delay time from said plurality of discharge delay time; and means for subtracting said average discharge delay time from said turnaround propagation time of said first voltage pulse or said second voltage or said third voltage pulse to calculate a corrected turnaround propagation time.

* * * * *